(12) United States Patent
Teo et al.

(10) Patent No.: US 11,761,983 B2
(45) Date of Patent: Sep. 19, 2023

(54) PROBE CARD INTEGRATED WITH A HALL SENSOR

(71) Applicant: GLOBALFOUNDRIES Singapore Pte. Ltd., Singapore (SG)

(72) Inventors: Guoquan Teo, Singapore (SG); Meng Yew Seah, Singapore (SG); Yongshun Sun, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1 day.

(21) Appl. No.: 17/472,722

(22) Filed: Sep. 13, 2021

(65) Prior Publication Data
US 2023/0083401 A1    Mar. 16, 2023

(51) Int. Cl.
  *G01R 1/07*    (2006.01)
  *G01R 1/073*    (2006.01)
  *G01R 31/28*    (2006.01)
  *G01R 35/00*    (2006.01)
  *G01R 33/07*    (2006.01)

(52) U.S. Cl.
  CPC ..... *G01R 1/07342* (2013.01); *G01R 31/2851* (2013.01); *G01R 33/07* (2013.01); *G01R 35/005* (2013.01)

(58) Field of Classification Search
  CPC combination set(s) only.
  See application file for complete search history.

(56) References Cited

U.S. PATENT DOCUMENTS

| | | | |
|---|---|---|---|
| 2001/0005141 A1* | 6/2001 | Pochmuller | G01R 1/0466 324/750.18 |
| 2006/0049823 A1* | 3/2006 | Suzuki | G01R 31/2886 324/202 |
| 2008/0122469 A1* | 5/2008 | Lu | G01R 1/07342 324/756.03 |
| 2009/0002001 A1* | 1/2009 | Caldwell | G01R 31/311 29/874 |
| 2013/0009659 A1 | 1/2013 | Liu et al. | |
| 2013/0099782 A1* | 4/2013 | Kejik | G01R 33/07 324/251 |
| 2013/0300402 A1 | 11/2013 | Liu et al. | |
| 2016/0320462 A1 | 11/2016 | Mather et al. | |
| 2021/0356497 A1* | 11/2021 | Huang | G01R 31/2868 |

OTHER PUBLICATIONS

King et al., "Webinar: Integrated Probe Card Solutions for Magnetic Testing", Presentation—PowerPoint Slides, Aug. 25, 2020, 40 pages, GMW Associates, Celadon Systems, Inc.

\* cited by examiner

*Primary Examiner* — Alvaro E Fortich
(74) *Attorney, Agent, or Firm* — VIERING, JENTSCHURA & PARTNER MBB

(57) ABSTRACT

The present disclosure provides a wafer probe card including: a non-magnetic printed circuit board (PCB) having a first side and a second side opposite the first side, the first side configured to face a magnet; a plurality of connection structures provided on the first side of the non-magnetic PCB; and a Hall sensor unit fixedly provided on the first side of the non-magnetic PCB, the Hall sensor electrically connected to at least one of the plurality of connection structures.

9 Claims, 6 Drawing Sheets

PROBE CARD INTEGRATED WITH A HALL SENSOR

TECHNICAL FIELD

The present disclosure generally relates to testing equipment for testing semiconductor devices. In particular, the present disclosure relates to wafer probers.

BACKGROUND

During the development or fabrication of semiconductor devices, the semiconductor devices (e.g., integrated circuit (IC) devices) are tested to assure quality and functionality. For example, various electrical and/or magnetic properties, parameters, and/or characteristics of the semiconductor devices may be tested over a wide range of environmental conditions while the semiconductor devices are still in wafer form. This testing may facilitate the detection of defective semiconductor dies before packaging.

To test semiconductor devices in wafer form, a wafer prober apparatus may be used to electrically probe a device under test (DUT), such as a die on a semiconductor wafer. Generally, the wafer prober apparatus includes a parametric testing module and a probe card electrically coupled to the parametric testing module. The probe card provides an electrical path between the parametric testing module and a DUT on the wafer, thereby permitting the testing and validation of the DUT on the wafer. A parametric testing module may include stable power source units and highly accurate and rapid measurement equipment for measuring voltage differences and currents of the DUT for a range of temperatures.

SUMMARY

According to various embodiments, there may be provided a wafer probe card including: a non-magnetic printed circuit board (PCB) having a first side and a second side opposite the first side, the first side configured to face a magnet; a plurality of connection structures provided on the first side of the non-magnetic PCB; and a Hall sensor unit fixedly provided on the first side of the non-magnetic PCB, the Hall sensor electrically connected to at least one of the plurality of connection structures.

According to various embodiments, there may be provided a method of calibrating a magnetic field generator including: providing a wafer probe card with an integrated Hall sensor unit disposed on a first side of the wafer probe card; arranging the wafer probe card so that the first side of the wafer probe card faces a magnetic surface of the magnetic field generator; adjusting a distance between the magnetic surface of the magnetic field generator and the first side of the wafer probe card to a calibration distance; and measuring Hall voltages from the integrated Hall sensor unit.

According to various embodiments, there may be provided a method of testing including: providing a first wafer probe card; characterizing an electromagnetic field from a magnet using the first wafer probe card; replacing the first wafer probe card with a second wafer probe card; providing a semiconductor device on a wafer chuck disposed below the second wafer probe card; and testing the semiconductor device using the magnet.

Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
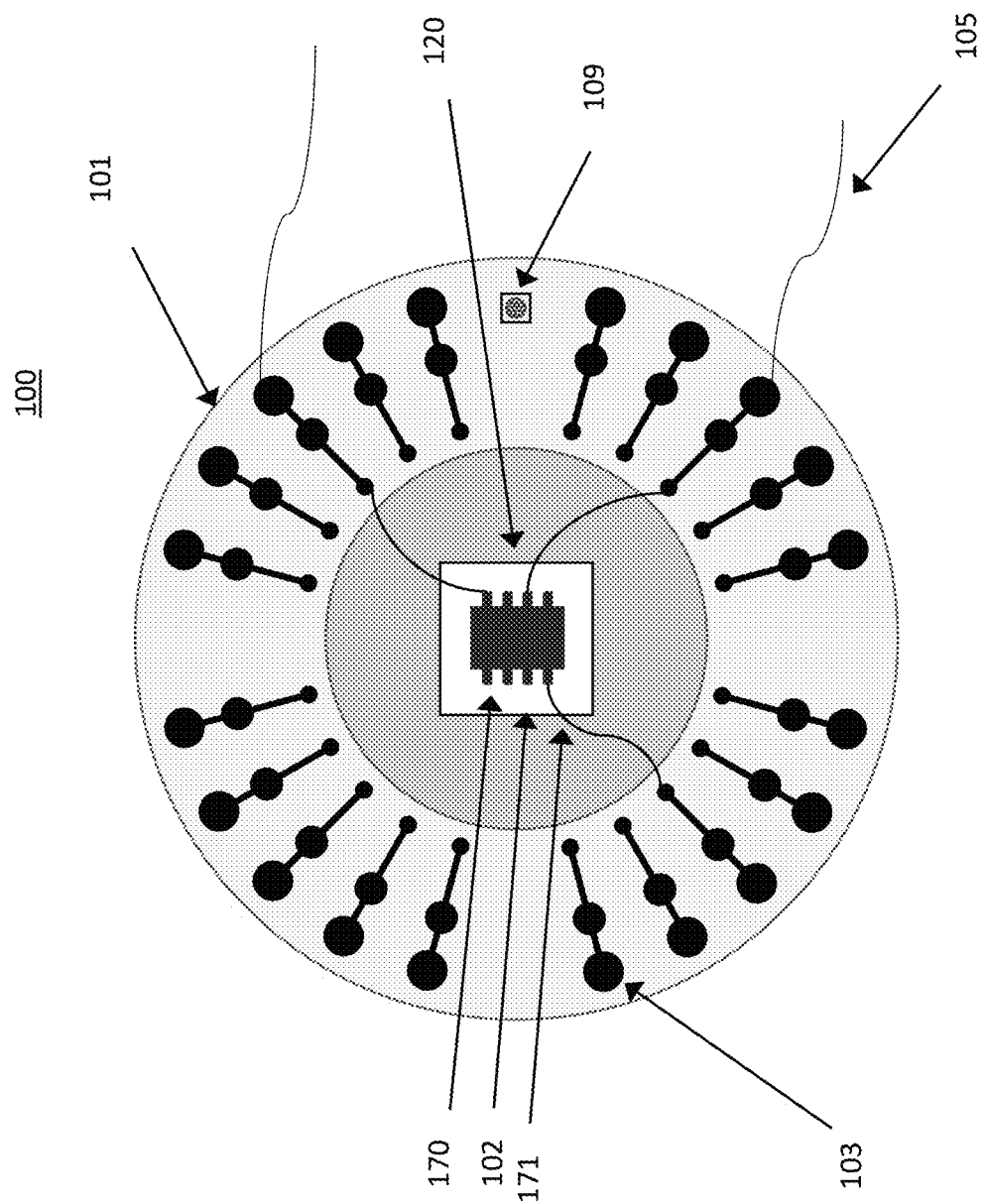
FIG. 1A illustrates a simplified top view of a wafer probe card and the relevant circuitry in accordance with various embodiments of the present disclosure.

The embodiments generally relate to probe cards for testing semiconductor devices and methods of testing the semiconductor devices. More particularly, the embodiments relate to probe cards including hall sensors, and the methods of providing probe cards with hall sensors.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while considering that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

The operation of some semiconductor devices involves a magnetic field. For example, compasses, accelerometers, gyroscopes, and the like, may utilize magnetic fields to function. These magnetic-based sensors are commonly used in, for example, mobile devices (e.g., smartphones, tablets, etc.) and in automobiles. The functionality of these magnetic-based sensors also needs to be tested prior to packaging. This requires applying a magnetic field to a magnetic-based DUT while the magnetic-based DUT is being tested by the parametric testing module.

The accuracy of the magnetic field strength provided by the magnetic field generator is critical. For example, a coercive field Hc is a disposition parameter that is a related to the magnetic field at which the DUT changes state. Due to the sensitivity of the field change with respect to height separation, the generated magnetic field must be accurately calibrated to effectively test the magnetic functionalities of semiconductor devices in wafer form. For calibration, the magnetic field strength must be measured at desired working distances from the magnetic field generator to the DUT. A Hall sensor unit provided at the desired working distances and position may be fully parametrized and the parametrizations may be used to calibrate the magnetic field generator.

In current testing systems for magnetic-based DUTs, the wafer prober apparatus includes a magnetic field generator integrated with a probe card. The magnetic field generator applies a magnetic field on a magnetic-based DUT. The probe card includes a circuit board with a removable probe core. The probe core can be removably installed from the center of the circuit board. The probe core has one or more probes that can probe a magnetic-based DUT. The probes are electrically connected to contacts that can transmit signals between a parametric testing module and the magnetic-based DUT.

A Hall sensor unit for calibrations is integrated in a calibration probe core that is used only for calibrations. Thus, the wafer prober apparatus must be partially disassembled between calibration and testing. A specialized probe core extractor/installer is used to remove a calibration probe core and insert a testing probe core. This increases down time between calibrations and testing and the calibrations may no longer be accurate after the partial disassembly. Additionally, the Hall sensor unit in the calibration probe core is only suitable for field measurements and is not suitable for characterizing a magnetic field of the magnetic field generator across a given current range.

Accordingly, there is a need to improve the conversion time between calibration and testing setups and minimize changes between the calibration assembly and the testing assembly. There is also a need to provide a Hall sensor unit that can facilitate a full characterization of the magnetic field generator. A probe card with an integrated Hall sensor unit for use with a universal wafer prober apparatus and that can easily interoperate with a magnetic field generator would address this need.

Figure 2:
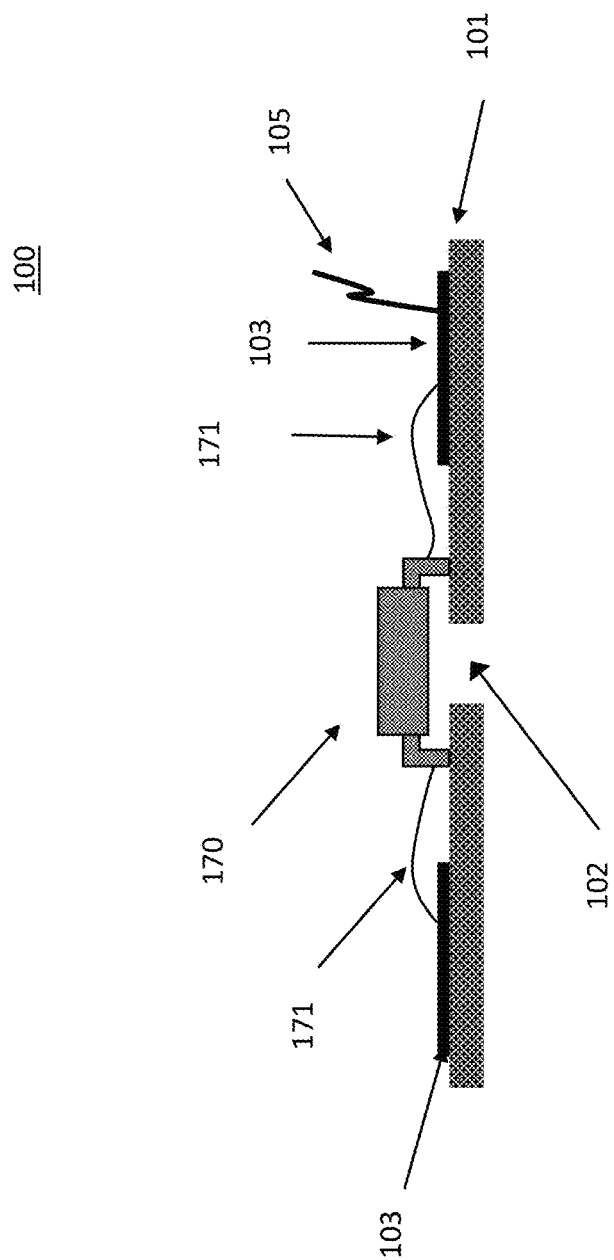
FIG. 2 illustrates a simplified cross-sectional view of a wafer probe card of FIG. 1 in accordance with various embodiments of the present disclosure.

FIGS. 1A and 2 illustrate simplified top and cross-sectional views of a wafer probe card 100 and the relevant circuitry in accordance with various embodiments of the present disclosure. Referring to FIG. 1A, a layout of a first side of a probe card 100 is shown. Probe card 100 may include a non-ferrous (i.e., non-magnetic) printed circuit board (PCB) 101. In some examples, the PCB 101 may include a hole 102 at the center. The probe card 100 may include a plurality of tester interface connection structures 103 (e.g., Hall sensor connectors and automated test equipment (ATE) connectors) arranged around the periphery of the wafer probe card on a first side (e.g. top side) of the PCB. The first side of the probe card 100 may face the magnet surface.

Figure 1B:
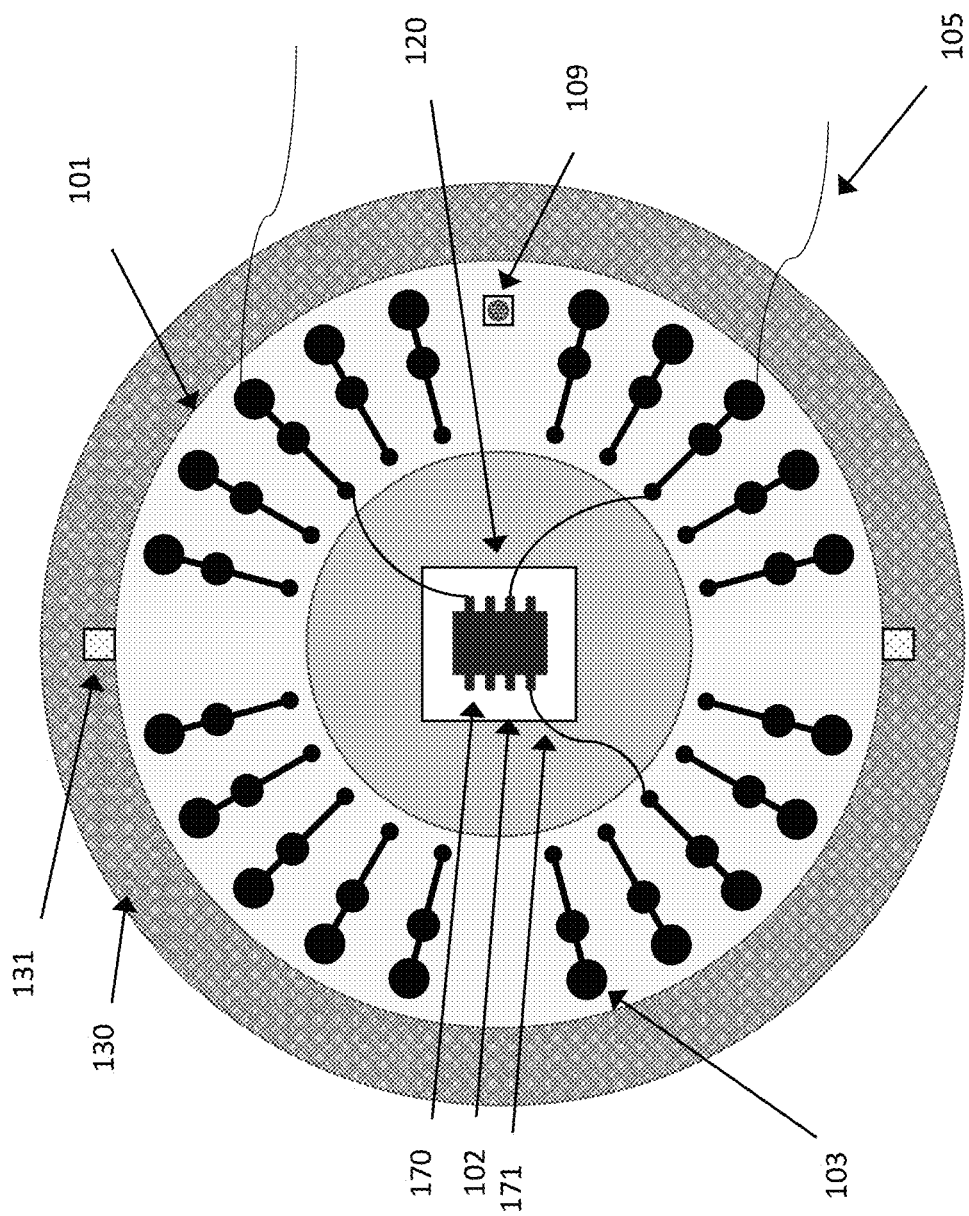
FIG. 1B illustrates a simplified top view of the wafer probe card of FIG. 1A on a wafer probe card mount.

The wafer probe card 100 may be configured to interoperate with a magnetic field generator 180 to facilitate fully calibrating the magnetic field generator 180 and testing of a semiconductor device or an integrated circuit device (e.g., DUT 190) on a wafer. When the wafer probe card 100 is configured for full calibration, a Hall sensor unit 170 is integrated into the probe card 100. The Hall sensor unit 170 may be a commercially available Hall sensor packaged chip. Referring to FIGS. 1 and 2, the Hall sensor unit 170 may be fixedly positioned at a center of the wafer probe card 100. Where the PCB 101 includes a hole at the center, the Hall sensor unit 170 may further be disposed above the hole 102. For example, the wafer probe card 100 may include a retainer structure 120 for the Hall sensor unit 170. The retainer structure 120 may be an IC socket adapter mounted on the wafer probe card 100. The Hall sensor unit 170 is electrically connected to at least one of the plurality of tester interface connection structures 103. The Hall sensor unit 170 may be electrically connected to the wafer probe card 100 by wirings 171 to the tester interface connection structures 103. Alternatively, the Hall sensor unit 170 may be electrically connected to the wafer probe card by patterned conductive traces in the PCB. The wafer probe card may be independently arranged between the magnetic field generator 180 and the DUT 190.

The magnetic field generator 180 may include a permanent magnet or electromagnet. The magnetic field generator may be a projected field magnet providing a uniform field at a position above the magnet surface. The magnetic field may be perpendicular to the magnet surface. For example, the magnetic field generator may be a GMW 5203 electromagnet. In such case, the magnetic field generator may provide a 4 mm×4 mm uniform field at a position up to 10 mm above the magnet surface. The magnetic field may also be horizontal to the magnet surface. For example, the magnetic field generator may be a GMW 5201 electromagnet. In such case, the magnetic field generator may provide a 2 mm×10 mm uniform field at a position from 2 mm up to 12 mm above the magnet surface.

At least a height, such as, a calibration distance CD and a working distance WD of the magnetic field generator 180 from a Hall sensor unit 170 or DUT 190, respectively, is adjustable. For example, the magnetic field generator 180 may be mounted to vertical guide rail mechanism 185 including a crank for adjusting the height of the magnetic field generator 180 along vertical guide rails. The crank may be manual or automated.

The wafer probe card 100 may be configured to couple to and interoperate with a universal parametric testing module. The parametric testing module may include stable power source units, programmable input/output ports, and/or highly-accurate and rapid measuring equipment that provides test patterns and measure voltage differences and currents. The parametric testing module may be used to measure the Hall voltages induced in the Hall sensor unit 170 by the magnetic field. Referring to FIG. 1A, for example, a parametric testing module may be electrically coupled to the Hall sensor unit 170 via wires or cables 105 connected to at least one the plurality of tester interface connection structures 103.

Figure 3:
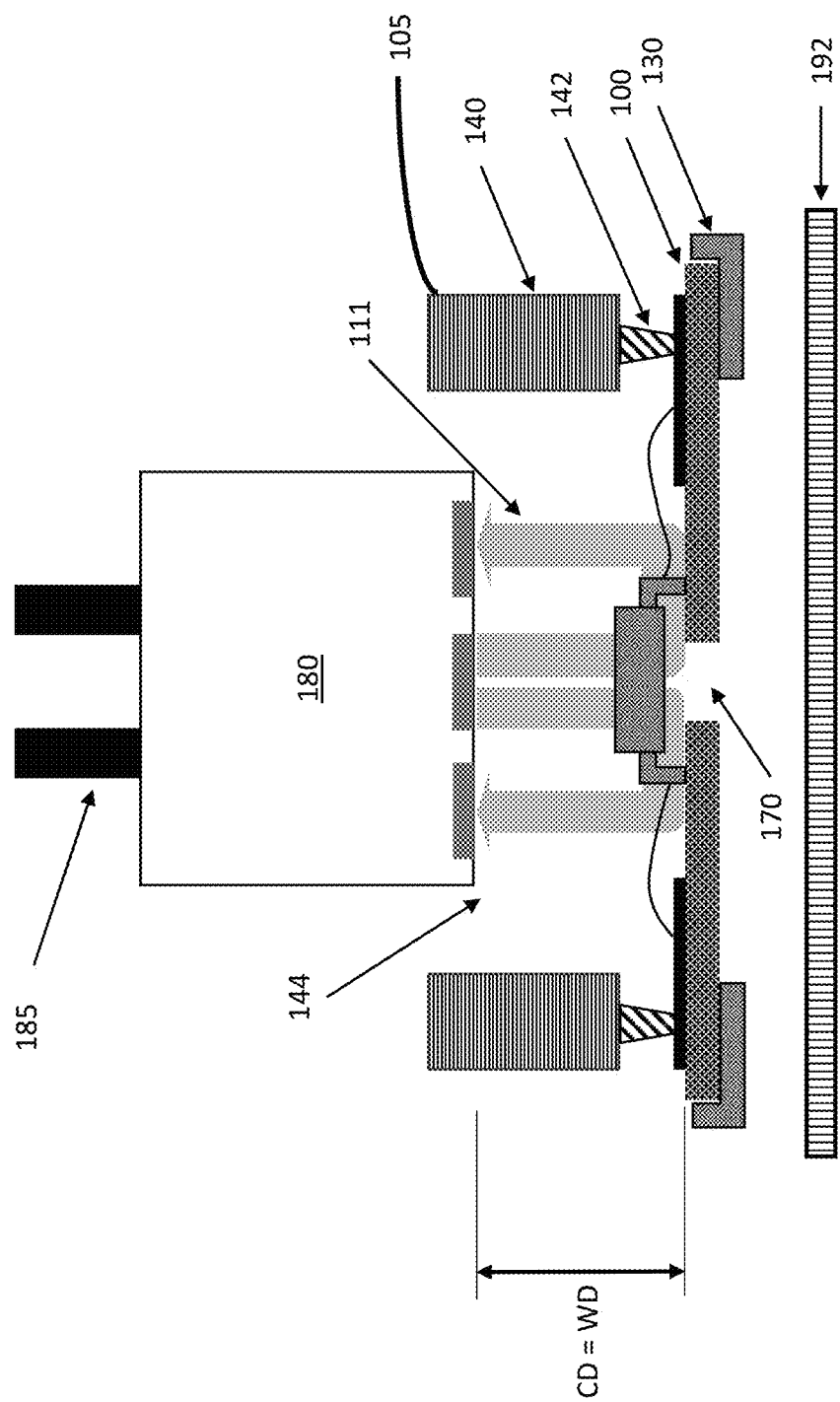
FIG. 3 illustrates a simplified cross-sectional view of a wafer probe card configured for calibration in accordance with various embodiments of the present disclosure.

FIG. 3 illustrates a simplified cross-sectional view of a wafer probe card 100 configured for calibration in accordance with various embodiments of the present disclosure. In this configuration, the Hall sensor unit 170 is integrated with the wafer probe card 100. A height of the magnetic field generator 180 may be adjusted via a vertical guide rail mechanism 185. The magnetic field generator 180 may be positioned so that a magnetic surface of the magnetic field generator 180 is a calibration distance CD above the first side of the wafer probe card 100. At the calibration distance CD, changes to the magnetic field 111 should cause different Hall voltages to be detected. The Hall sensor unit 170 is coupled to the parametric testing module. The different Hall voltage values at various magnetic field strengths can be measured by the parametric testing module. For example, a test program may be executed to vary the magnetic field from the electromagnet and the changes to the Hall voltages on the Hall Sensor are measured. Measurement is done using the parametric testing module.

Referring to FIG. 3, the wafer probe card 100 is loaded onto a wafer card holder mount 130 so that the Hall sensor unit 170 is under the magnetic field generator 180 and within the magnetic field 111. A wafer chuck 192 may be disposed under the wafer card holder mount 130, but the wafer chuck is not loaded with a wafer during calibration. A tester head 140 may be positioned above the wafer probe card 100. The wafer probe card 100 may be held in position on the wafer card holder mount 130 by the tester head 140. The tester head 140 may include a cavity 144. The magnetic field generator 180 may be disposed in the cavity 144. The tester head 140 may include a plurality tester head pins 142 arranged around the periphery of the tester head 140 on a surface of the tester head 140 facing the wafer probe card 100. Some of the plurality of tester head pins 142 may be arranged and configured to connect to some of the plurality of interface connection structures 103 on the wafer probe card 100. The tester head pins 142 may be electrically coupled to the parametric testing module via cables 105.

Figure 4:
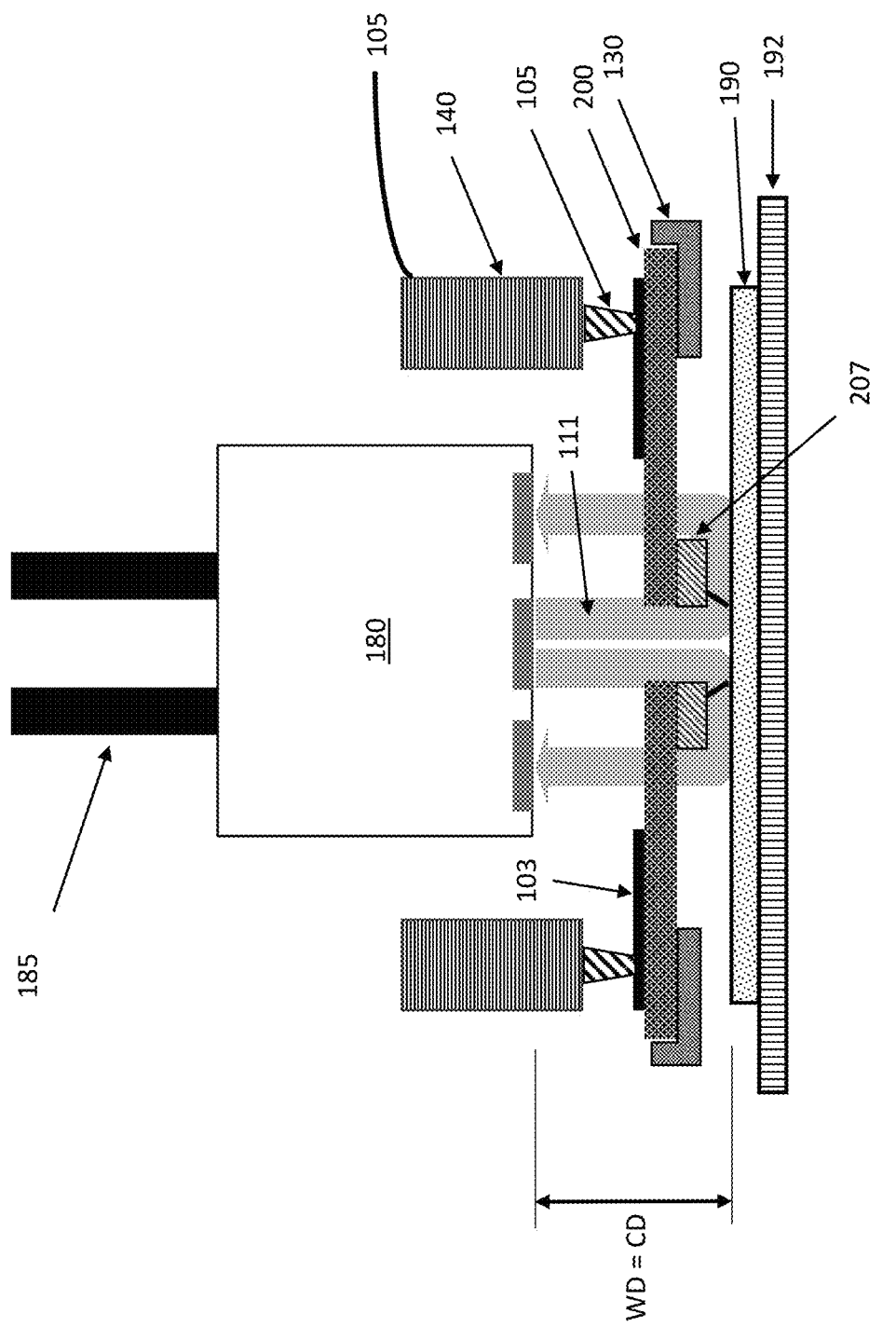
FIG. 4 illustrates a simplified cross-sectional view of a wafer probe card configured for testing in accordance with various embodiments of the present disclosure.

FIG. 4 illustrates a simplified cross-sectional view of a wafer probe card 200 configured for testing in accordance with various embodiments of the present disclosure. In this configuration, the wafer probe card 200 is similar to wafer probe card 100, however, the Hall sensor unit 170 is omitted from the wafer probe card 200. Instead, a DUT probe head 207 is fixedly arranged on a second side of the wafer probe card 200. A DUT 190 may be loaded on a wafer chuck 192. The wafer probe card 200 is loaded onto a wafer card holder mount 130 so that the DUT probe head 207 is under the magnetic field generator 180 and within the magnetic field 111 and above the DUT 190. That is, the wafer chuck 192 is disposed below the wafer probe card mount 130 and the wafer probe card 200. The wafer chuck 192 may be moved to position the DUT 190 so that the DUT 190 comes into contact with the DUT probe head 207. A tester head 140 may be positioned above the wafer probe card 200 and around the magnetic field generator 180. The magnetic field generator 180 may be positioned so that a magnetic surface of the magnetic field generator is a working distance WD above the DUT 190. At the working distance, changes to the magnetic field may give rise to different Hall voltages. The effects of the different Hall voltage values at various magnetic field strength on the DUT 190 can be measured by the parametric testing module via connections to the tester interface connection structures 103. Additionally or alternatively, the switching resistance state of a DUT 190 may also change as the magnetic field changes. The resistance versus magnetic field relationship is measured by the parametric testing module via connections to the tester interface connection structures 103.

As discussed above, in current testing systems for magnetic-based DUTs, setup requires hardware modification to the magnetic field generation including a pole change. The hardware modification requires a special tool and handling to change out the probe core.

However, in the embodiments provided, a wafer probe card 100 may include an integrated Hall sensor unit 170. The wafer probe card 100 may be loaded on a wafer probe card mount 130 using a standard loader for a conventional wafer probe apparatus system. Referring to FIGS. 3 and 4, the wafer chuck 192 and the wafer probe card mount 130 may be components of a conventional wafer probe apparatus system. For example, referring to FIG. 1B, wafer probe card 100 may include alignment markers 109 for loading. The wafer probe card mount 130 may include a recess 131 for loading and/or removing the wafer probe card 100. No modification would be required with existing standard testing equipment.

The modified probe card also allows flexibility in calibration and testing by swapping probe cards using conventional equipment. Referring to FIGS. 3 and 4, a wafer probe card 100 with an integrated Hall sensor unit 170 is disposed on the wafer probe card mount 130 for calibration and a wafer probe card 200 with a DUT probe head 207 is disposed on the wafer probe card mount 130 for testing. A conventional wafer probe apparatus may load and unload wafer probe card 100 and 200 depending on the use.

In some embodiments, referring to FIG. 1A, the Hall sensor unit 170 may be a packaged Hall sensor chip integrated on a side of the probe card configured to face a magnet. The packaged Hall sensor chip may be mechanically fastened to the probe card. The probe card may include a retaining structure 120 for mechanically receiving the Hall sensor unit 170. Alternatively, the Hall sensor unit 170 may be adhered with adhesives to the probe card. The Hall sensor unit 170 may be centrally positioned over the hole 102 of the PCB card.

The height of the magnetic field generator is adjustable relative to wafer probe card 100 and a DUT 190. Referring to FIG. 3, the calibration distance CD is a distance between a magnetic surface of the magnetic field generator 180 and a first surface of the wafer probe card 100 (i.e., the surface facing the magnetic field generator 180). Referring to FIG. 4, the working distance WD is a distance between a magnetic surface of the magnetic field generator 180 (i.e., the surface facing the DUT 190) and a surface of the DUT 190. As shown in FIG. 4, a wafer probe card 200 is disposed between the magnetic field generator 180 and the DUT 190. To characterize the magnetic field at a DUT 190 arranged at a desired working distance WD from the magnetic field generator 180, the calibration distance CD should be the same as the desired working distance WD. And vice versa, the working distance WD should be the same as the calibration distance CD, otherwise the calibration may not be accurate. The working distance WD and calibration distance CD may be about 5 millimeter (mm) to about 10 mm.

Figure 5:
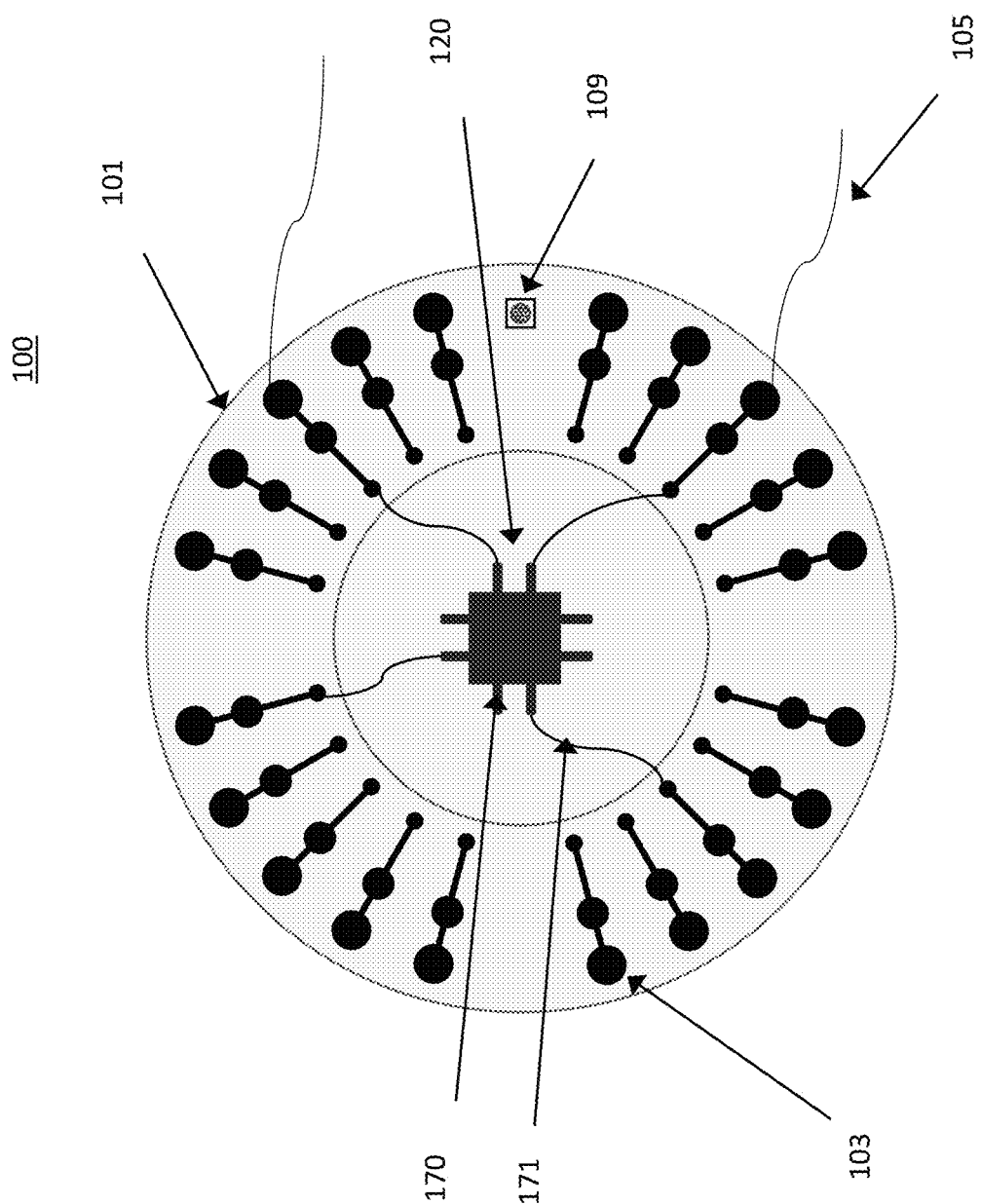
FIG. 5 illustrates a simplified top view of another wafer probe card and the relevant circuitry in accordance with various embodiments of the present disclosure.

FIG. 5 illustrates a simplified top view of another wafer probe card 100 and the relevant circuitry in accordance with various embodiments of the present disclosure. Referring to FIG. 5, a Hall sensor unit 170 may be a Hall sensor die, e.g., a wire-bonded Hall die. The Hall sensor die may be integrated on a side of the wafer probe card 100 configured to face a magnet. The wire-bonded Hall die may be adhered to the surface at the center of the wafer probe card 100.

In the illustrated embodiments, the wafer probe card 100 is depicted as being circular, however the shape of the wafer probe card may be other shapes, e.g., triangular, square, hexagonal, elliptical, etc.

The following examples pertain to various embodiments of the present disclosure.

Example 1 may include a wafer probe card including: a non-magnetic printed circuit board (PCB) having a first side and a second side opposite the first side, the first side configured to face a magnet; a plurality of connection structures provided on the first side of the non-magnetic PCB; and a Hall sensor unit fixedly provided on the first side of the non-magnetic PCB, the Hall sensor electrically connected to at least one of the plurality of connection structures.

Example 2 may include the wafer probe card of example 1 and/or some other examples herein, wherein the Hall sensor unit is arranged at a center of the non-magnetic PCB.

Example 3 may include the wafer probe card of example 2 and/or some other examples herein, wherein the center of the non-magnetic PCB includes a hole.

Example 4 may include the wafer probe card of example 3 and/or some other examples herein, wherein the Hall sensor unit is arranged over the hole.

Example 5 may include the wafer probe card of example 4 and/or some other examples herein, further including: a holder mounted on the first side of the PCB and configured to retain the Hall sensor unit in a fixed position.

Example 6 may include the wafer probe card of example 4 and/or some other examples herein, wherein each of connection structures includes a first connection portion and a second connection portion.

Example 7 may include the wafer probe card of example 6 and/or some other examples herein, wherein the Hall sensor unit is wired to the first connection portion.

Example 8 may include the wafer probe card of example 7 and/or some other examples herein, wherein the second connection portion is configured for connecting to a parametric testing module.

Example 9 may include the wafer probe card of example 4 and/or some other examples herein, wherein the Hall sensor unit is a packaged Hall sensor chip.

Example 10 may include the wafer probe card of example 9 and/or some other examples herein, wherein the packaged Hall sensor chip is mounted to the first side of the PCB.

Example 11 may include the wafer probe card of example 1 and/or some other examples herein, wherein the Hall sensor unit is a Hall sensor die.

Example 12 may include a method of calibrating a magnetic field generator including: providing a wafer probe card with an integrated Hall sensor unit disposed on a first side of the wafer probe card; arranging the wafer probe card so that the first side of the wafer probe card faces a magnetic surface of the magnetic field generator; adjusting a distance between the magnetic surface of the magnetic field generator and the first side of the wafer probe card to a calibration distance; and measuring Hall voltages from the integrated Hall sensor unit.

Example 13 may include the method of example 12, wherein measuring Hall voltages is performed for various current levels.

Example 14 may include a method including: providing a first wafer probe card; characterizing an electromagnetic field from a magnet using the first wafer probe card; replacing the first wafer probe card with a second wafer probe card; providing a semiconductor device on a wafer chuck disposed below the second wafer probe card; and testing the semiconductor device using the magnet.

Example 15 may include the method of Example 14, further including: adjusting a distance between the magnet and the first wafer probe card to a first distance; and characterizing the electromagnetic field from the magnet using the first wafer probe card at the first distance.

Example 16 may include the method of Example 15, further including: adjusting a distance between the magnet and the semiconductor device to a second distance; and testing the semiconductor device using the magnet at the second distance.

Example 17 may include the method of Example 16, wherein the first distance and the second distance are the same.

Example 18 may include the method of Example 17, wherein the first wafer probe card includes a printed circuit board (PCB) with an integrated Hall sensor unit and the second wafer probe card includes a PCB with a probe head configured for the semiconductor device.

Example 19 may include the method of Example 18, further including: providing the first wafer probe card on a wafer card holder mount, wherein the first wafer probe card includes a first side and a second side opposite the first side, the first side is configured to face the magnet when the first wafer probe card is on the wafer card holder mount, and wherein the integrated Hall sensor unit is disposed on the first side of the first wafer probe card.

Example 20 may include the method of Example 19, further including: removing the first wafer probe card from the wafer card holder mount; providing the second wafer probe card on the wafer card holder mount; wherein the second wafer probe card includes a first side and a second side opposite the first side, the second side is configured to face the semiconductor when the second wafer probe card is on the wafer card holder mount, and wherein the probe head is disposed on the second side of the second wafer probe card.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A wafer probe card comprising:
a non-magnetic printed circuit board (PCB) having a first side and a second side opposite the first side, the first side configured to face a magnet;
a plurality of connection structures provided on the first side of the non-magnetic PCB; and
a Hall sensor unit fixedly provided on the first side of the non-magnetic PCB, the Hall sensor unit electrically connected to at least one of the plurality of connection structures,
wherein the Hall sensor unit is arranged at a center of the non-magnetic PCB,
wherein the center of the non-magnetic PCB includes a hole,
wherein the Hall sensor unit is arranged over the hole.

2. The wafer probe card of claim 1, further comprising:
a holder mount on the first side of the PCB and configured to retain the Hall sensor unit in a fixed position.

3. The wafer probe card of claim 1, wherein each of connection structures includes a first connection portion and a second connection portion.

4. The wafer probe card of claim 3, wherein the Hall sensor unit is wired to the first connection portion.

5. The wafer probe card of claim 4, wherein the second connection portion is configured for connecting to a parametric testing module.

6. The wafer probe card of claim 1, wherein the Hall sensor unit is a packaged Hall sensor chip.

7. The wafer probe card of claim 6, wherein the packaged Hall sensor chip is mounted to the first side of the PCB.

8. The wafer probe card of claim 1, wherein the Hall sensor unit is a Hall sensor die.

9. The wafer probe card of claim 6, wherein the Hall sensor unit is electrically connected to the first connection portion by patterned conductive traces in the PCB.

* * * * *